US 9,197,403 B2

(12) United States Patent
Gauthier et al.

(10) Patent No.: US 9,197,403 B2
(45) Date of Patent: Nov. 24, 2015

(54) CALIBRATION ARRANGEMENT FOR FREQUENCY SYNTHESIZERS

(75) Inventors: Laurent Gauthier, Pins-Justaret (FR); Dominique Delbecq, Fonsorbes (FR); Jean-Stephane Vigier, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/415,961

(22) PCT Filed: Jul. 20, 2012

(86) PCT No.: PCT/IB2012/001660
§ 371 (c)(1),
(2), (4) Date: Jan. 20, 2015

(87) PCT Pub. No.: WO2014/013289
PCT Pub. Date: Jan. 23, 2014

(65) Prior Publication Data
US 2015/0146835 A1 May 28, 2015

(51) Int. Cl.
H03D 3/24 (2006.01)
H04L 7/033 (2006.01)
H03L 7/197 (2006.01)
H03C 3/09 (2006.01)

(52) U.S. Cl.
CPC ............ *H04L 7/0331* (2013.01); *H03C 3/0925* (2013.01); *H03L 7/197* (2013.01)

(58) Field of Classification Search
CPC ..... H04L 7/033; H04L 7/0337; H04L 7/0814; H04L 7/0331; H04L 7/0338
USPC .................................................. 375/354–376
See application file for complete search history.

(56) References Cited

U.S. PATENT DOCUMENTS

| 5,027,429 | A |   | 6/1991  | Kojima                    |
|-----------|---|---|---------|---------------------------|
| 5,334,952 | A | * | 8/1994  | Maddy et al. ...... 331/1 A |
| 5,495,206 | A |   | 2/1996  | Hietala                   |
| 5,568,098 | A |   | 10/1996 | Horie et al.              |
| 5,629,651 | A | * | 5/1997  | Mizuno ............ 331/34 |
| 5,757,238 | A | * | 5/1998  | Ferraiolo et al. .... 331/16 |
| 5,825,257 | A | * | 10/1998 | Klymyshyn et al. ... 332/100 |
| 5,978,425 | A | * | 11/1999 | Takla ............... 375/374 |
| 6,417,738 | B1| * | 7/2002  | Lautzenhiser ....... 331/17 |

(Continued)

OTHER PUBLICATIONS

International Search Report and Written Opinion correlating to PCT/IB2012/001660 dated Apr. 29, 2013.

*Primary Examiner* — James M Perez

(57) ABSTRACT

An electronic device has a calibration arrangement for controlling a frequency characteristic of a PLL circuit having a phase comparator having an output for generating a phase difference signal, a voltage controlled oscillator and a divider. The divisor of the divider is programmable, and the oscillator is also directly modulated by an oscillator modulation signal. A modulation unit has a modulation input for receiving a modulation signal and generates the oscillator modulation signal and the divisor such that modulation generates a predefined change of the output frequency and a change of the divisor proportional to said predefined change. The calibration arrangement receives the phase difference signal, and has a ripple detector for providing a detector output signal by detecting a ripple on the phase difference signal correlated to edges in the modulation signal. A calibration control unit adjusts the oscillator modulation signal based on the detector output signal such that the ripple is reduced.

17 Claims, 4 Drawing Sheets

(56) References Cited

U.S. PATENT DOCUMENTS

| | | |
|---|---|---|
| 7,310,022 B2 * | 12/2007 | Doi ................................ 331/34 |
| 7,561,652 B2 * | 7/2009 | Hall et al. ..................... 375/373 |
| 8,198,943 B2 * | 6/2012 | van de Beek et al. ........... 331/17 |
| 8,339,165 B2 * | 12/2012 | Dunworth et al. ............ 327/152 |
| 8,358,729 B2 * | 1/2013 | Bae et al. ...................... 375/374 |
| 8,471,611 B2 * | 6/2013 | Sfikas et al. .................. 327/156 |
| 8,525,598 B2 * | 9/2013 | Saini .............................. 331/34 |
| 8,767,868 B2 * | 7/2014 | Friedrich et al. ............. 375/296 |
| 8,917,759 B2 * | 12/2014 | Xu ................................. 375/221 |
| 2004/0090909 A1 * | 5/2004 | Khlat ............................ 370/215 |
| 2004/0223575 A1 * | 11/2004 | Meltzer et al. ................ 375/376 |
| 2006/0222134 A1 * | 10/2006 | Eldredge et al. .............. 375/371 |
| 2006/0267697 A1 | 11/2006 | Lee et al. |
| 2006/0284687 A1 * | 12/2006 | Abel .............................. 331/16 |
| 2007/0096841 A1 * | 5/2007 | Connell et al. ................ 331/183 |
| 2007/0188242 A1 * | 8/2007 | Song .............................. 331/16 |
| 2007/0252654 A1 * | 11/2007 | Beyer et al. .................... 331/16 |
| 2010/0329388 A1 * | 12/2010 | Ko ................................. 375/300 |
| 2011/0299638 A1 * | 12/2011 | Gauthier ....................... 375/343 |

\* cited by examiner

CALIBRATION ARRANGEMENT FOR FREQUENCY SYNTHESIZERS

FIELD OF THE INVENTION

This invention relates to electronic devices having a calibration arrangement for controlling a frequency characteristic of a circuit. More specifically, the invention is in the field of frequency synthesizers and digitally controlled oscillators having two modulation inputs and comprising the calibration arrangement.

BACKGROUND OF THE INVENTION

United States patent application US200710252654 describes designs for a frequency modulator based on a voltage controlled oscillator (VCO). A frequency modulator is provided for generating an output signal with a frequency that is a function of a modulation signal, wherein the modulation signal can assume different discrete modulation values, and a predetermined frequency value of the output signal is associated with each modulation value. The modulator contains a closed phase locked loop (PLL) with a loop filter for providing a first control voltage, with a voltage controlled oscillator for generating the output signal, and with a switchable frequency divider for deriving a frequency-divided signal. The divisor is the factor by which the input frequency of the divider is divided. Also a modulation unit is provided which gives, at a first output, values of the divisor that are a function of the modulation signal, and at a second output, a second control voltage that is a function of the modulation signal. The oscillator has a first control input connected to the loop filter and has a second control input connected to the second output of the modulation unit, and is designed to generate the output signal as a function of the first control voltage and the second control voltage. The frequency divider is connected to the first output of the modulation unit and is designed to derive the frequency-divided signal in such a manner that it has instantaneous frequencies that are a function of the divisor values.

A problem of the device known from US2007/0252654 is that a frequency step due to modulation does not accurately follow the modulation input.

SUMMARY OF THE INVENTION

The present invention provides an electronic device, and a method, as described in the accompanying claims.

Specific embodiments of the invention are set forth in the dependent claims. Aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings.

Elements in the figures are illustrated for simplicity and clarity and have not necessarily been drawn to scale. In the Figures, elements which correspond to elements already described may have the same reference numerals.

DETAILED DESCRIPTION OF THE PREFERRED EMBODIMENTS

Figure 1:
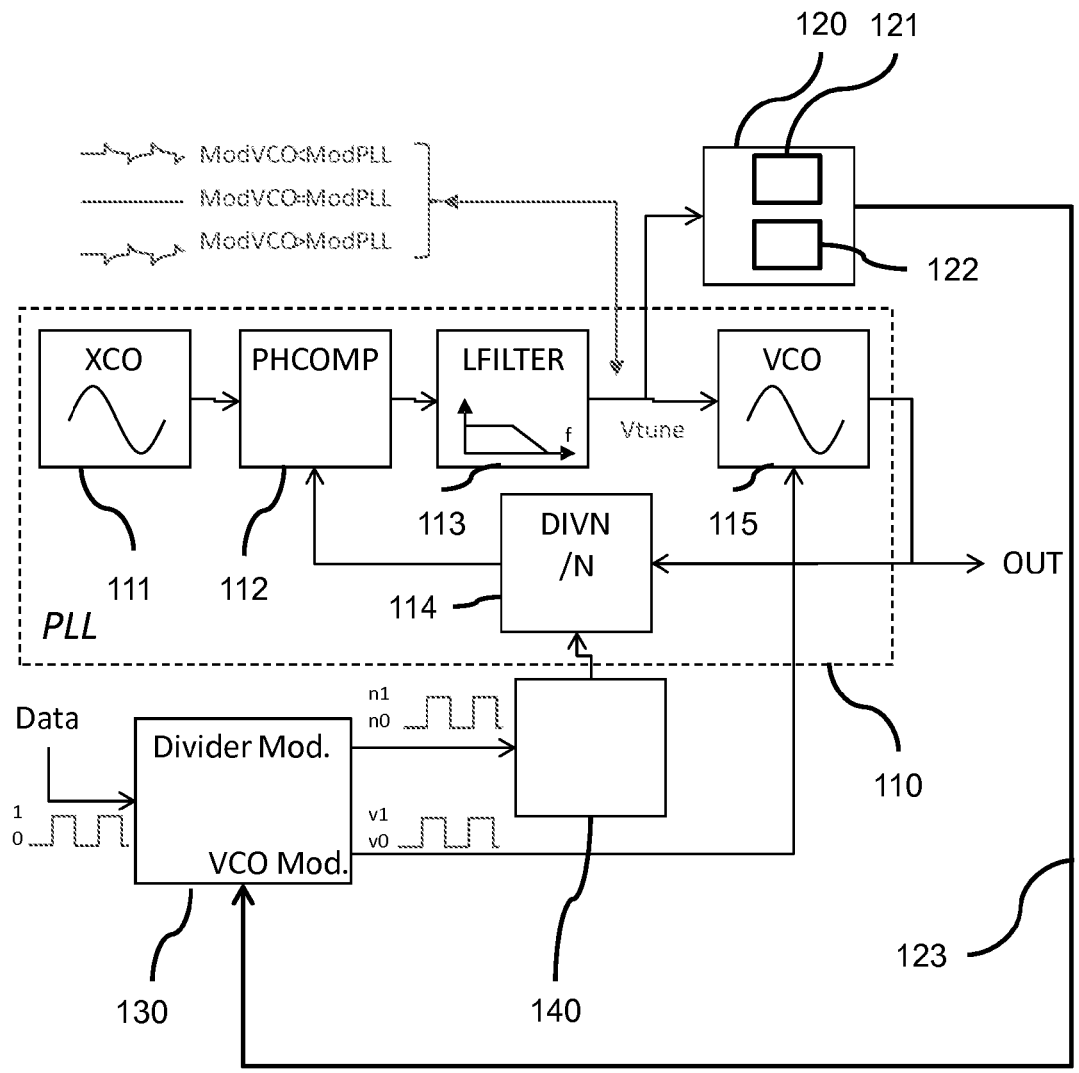
FIG. 1 shows an example of an electronic device having a calibration arrangement.

FIG. 1 shows an example of an electronic device having a calibration arrangement. The device may include a frequency generator, for example for use in phase or frequency modulation for data transmission. The device 100 has a calibration arrangement 120 for controlling a frequency characteristic of a circuit 110, in the example a phase locked loop (PLL).

The circuit has a phase comparator 112 (PHCOMP) having a first input for receiving a feedback signal and a second input for receiving a reference frequency from a reference source 111, for example a crystal oscillator indicated by XCO. The phase comparator has a comparator output, which is coupled to an input of a voltage controlled oscillator (VCO) 115 via a low pass filter (LFILTER) 113 for generating a phase difference signal (Vtune).

The voltage controlled oscillator 115 has a first control input coupled to the phase comparator output and a second control input for receiving a second control signal. The oscillator has an oscillator output for outputting an oscillator signal at an oscillation frequency controlled by the first and second control input. The oscillator signal provides the output signal of the circuit. Changing either the first or the second control signal will change the oscillator frequency, enabling a dual port control for modulating the frequency of the output signal. The oscillator may be a digitally controlled oscillator having an arrangement of switched capacitors such as varactors for changing the oscillator frequency.

The circuit further has a divider 114 (DIVN) having an input coupled to the oscillation signal and an output for generating the feedback signal, the divisor (indicated by /N) of the divider being programmable via a divisor input. The divisor input may be coupled to a tuning unit 140, which determines a nominal value for the divisor for generating a required frequency, e.g. a nominal carrier wave frequency. The tuning unit may have an input for receiving a digital modulation value representing a change of the divisor value, and may calculate an actual value for the divisor based on the nominal divisor value and the digital modulation value.

For example, Phase Shift keying (PSK) is a digital modulation scheme that conveys data by changing, or modulating, the phase of a reference signal (called the carrier wave). Also, a Frequency Shift Keying (FSK) modulation may be applied. Instead of operating with respect to a constant reference wave, a broadcast can operate with respect to itself. Digital modulation schemes use a finite number of distinct signals to represent digital data. PSK uses a finite number of phases, each phase assigned to a unique pattern of binary digits. Usually, each phase encodes an equal number of bits. Each pattern of bits forms the symbol that is represented by the particular phase. The demodulator, which is designed specifically for the symbol-set used by the modulator, determines the phase of the received signal and maps it back to the symbol it represents, thus recovering the original data. Quadrature phase-shift keying (QPSK) uses a constellation diagram with Gray coding. Each adjacent symbol only differs by one bit. QPSK uses four points on the constellation diagram, equispaced around a circle. With four phases, QPSK can encode two bits per symbol. A further system called Offset quadrature phase-shift keying (OQPSK) is a variant of phase-shift keying modulation using 4 different values of the phase to transmit. In the example, changing the divisor in the divider will lead to a steady state different frequency. OQPSK may be considered a particular case of FSK with specific frequency deviation and data rate.

For digital modulation such as described above modulating a PLL is a possible, and it is proposed to modulate both the VCO and the divider to accommodate the large bandwidth of the data, which is called dual port modulation of the PLL. To have correct modulation for a minimum BER (Bit Error Rate), it is required to minimize the Error Vector Magnitude (EVM). This can be accomplished by having a precise modulation gain on the VCO. Due to the analog nature of the VCO, a calibration is required to define this gain. Thereto the calibration arrangement as described below in detail optimizes the resources and the time needed for this calibration.

The circuit has, for dual port modulation, a modulation unit 130 having a modulation input for receiving a modulation signal (Data) and a first modulation output (VCO Mod) coupled to the second control input of the voltage controlled oscillator and a second modulation output (Divider Mod) coupled to the divisor input. The modulation of the VCO can be done by providing various voltages step. Alternatively, various digital words may be provided to the VCO to switch various capacitors banks or varicaps. The modulation unit is controllable by a control signal 123 from the calibration arrangement 120 as described now.

In operation, the data signal provides a digital modulation pattern of logical signal values 0 and 1, as schematically indicate in the Figure near the Data input. The first output VCO Mod generates an oscillator modulation signal corresponding to the Data input, which signal varies between voltage levels v0 and v1 or respective digital control values. The second output Divider Mod generates two values for the divisor n0 and n1, which divisor values provide a nominal modulation of the frequency generated via the PLL, also indicated by ModPLL. Effectively the circuit constitutes a controllable oscillator based on the phase locked loop 110, enabling on a first port direct modulation via said VCO mod signal which modulation is matched by on a second port digitally setting the oscillator frequency by changing said divisor. Hence a change of the modulation signal Data generates a predefined change of the output frequency via said oscillator modulation signal (VCO mod) and a change of the divisor (Divider Mod) proportional to said predefined change via said divisor values. When modulation is perfect the direct frequency modulation of VCO equals the frequency modulation of PLL (as programmed by divider), and the error voltage on Vtune is zero. For reducing the error voltage a calibration process is used to adjust VCO modulation gain, e.g. by effectively changing the amplitude of the modulation signal or the digital control words, depending on the phase difference signal (Vtune).

The calibration arrangement 120 has a calibration input for receiving the phase difference signal (Vtune) and a ripple detector 121. The ripple detector is arranged for providing a detector output signal by detecting a ripple on the phase difference signal correlated to edges in the modulation signal. Optionally, the ripple detector may have a peak to peak detector, and may include a filter tuned to filter out the ripple corresponding to the frequency of the data signal. For example, in a calibration mode, a predefined data signal may be supplied as a calibration test signal to the Data input of the modulation unit, and the filter may be set to correspondingly filter such frequency components from the phase difference signal Vtune.

In FIG. 1, indicated by an arrow to the phase difference signal (Vtune), examples of said ripple on the phase difference signal are schematically shown. The upper example, marked ModVCO<ModPLL indicating the proportional relationship between said oscillator modulation signal (VCO Mod) and the nominal, intended modulation via the divisor values, shows a ripple occurring when the direct modulation signal effectively achieves a too small change of the modulation frequency. The middle example, marked ModVCO=ModPLL, shows no ripple, which occurs when the direct modulation signal effectively achieves the intended change of the modulation frequency. The lower example, marked ModVCO>ModPLL, shows a ripple occurring when the direct modulation signal effectively achieves a too large change of the modulation frequency.

The calibration arrangement further has a calibration control unit 122 for adjusting the second control signal of the oscillator (VCO), i.e. said oscillator modulation signal (VCO mod), based on the detector output signal such that the ripple is reduced. For example the modulation unit 130 is controlled via said control signal 123 to output different values for said voltage levels v0 and v1, so that the direct modulation of the VCO more closely follows the nominal change of the oscillator frequency as determined by said divisor values n0 and n1.

Optionally the ripple detector detects the polarity of the ripple with respect to the edges in the modulation signal (Data). The calibration control unit adjusts the oscillator modulation signal in a direction opposite to the detected polarity so that the ripple will be reduced. For example, a successive approximation method may be applied to determine the amount of adjustment. Alternatively, the ripple detector may detect the amplitude of the ripple and derive the adjustment based thereon.

Optionally the calibration arrangement is arranged for said adjusting the second control signal (said oscillator modulation signal VCO Mod) by setting a modulation gain. The modulation gain may be set by adjusting a parameter in the oscillator VCO, for example a bias current. As such, various further options to change the modulation gain of an oscillator are known.

Optionally, the calibration arrangement is arranged for setting the modulation gain via changes of said gain according to a successive approximation process. In such process, known as such, a sequence of successive changes is applied, each change smaller than the previous one, and the direction of change being determined based on the polarity of the ripple. An example is elucidated with reference to FIG. 3 below.

Figure 2:
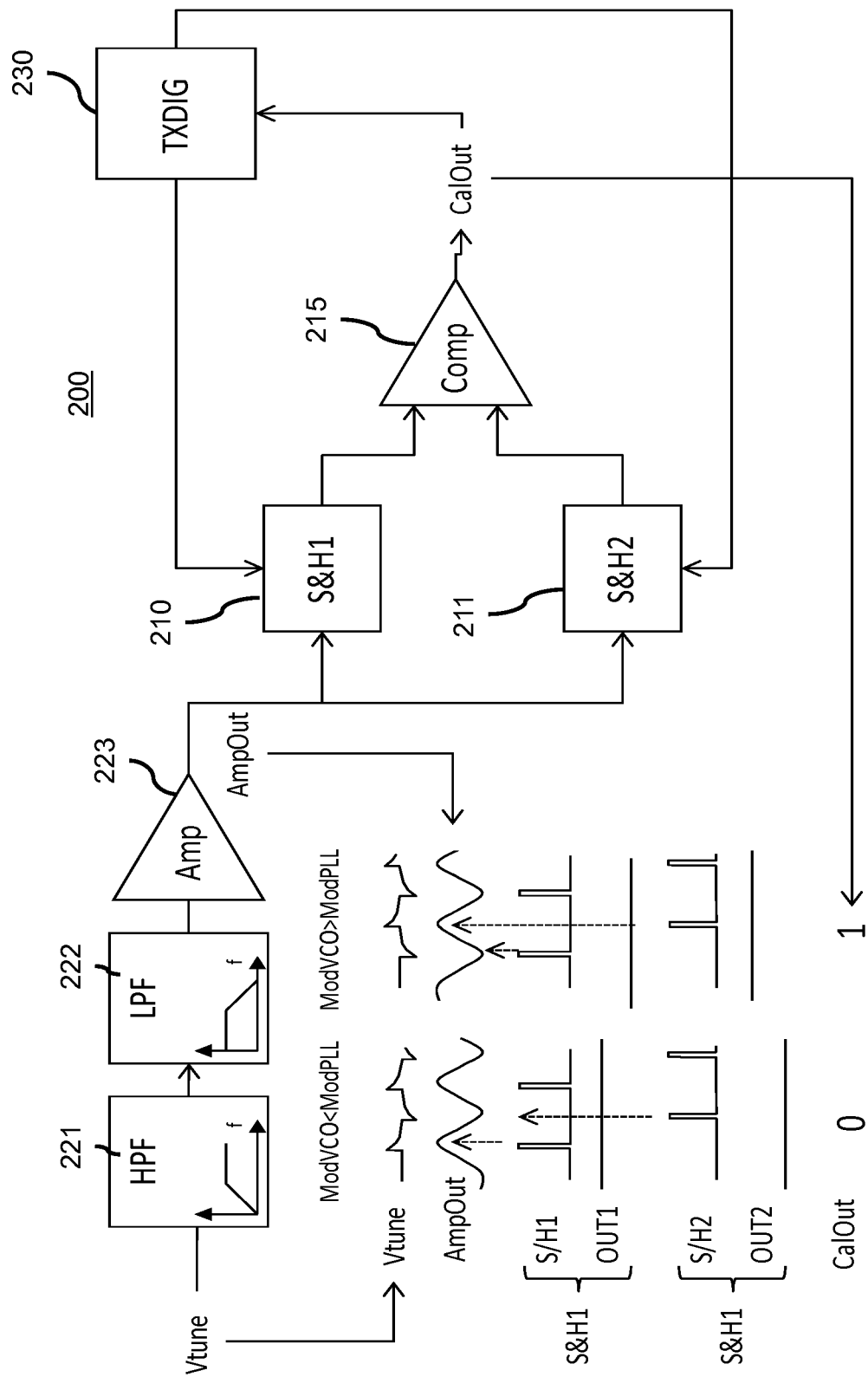
FIG. 2 shows an example of a calibration arrangement having a ripple detector.

FIG. 2 shows an example of a calibration arrangement having a ripple detector. The calibration arrangement 200 has a calibration input for receiving the phase difference signal (Vtune). The ripple detector is arranged for providing a detector output signal (CalOut) by detecting a ripple on the phase difference signal correlated to edges in the modulation signal. The ripple detector may have a filter section to effectively filter and amplify the ripple. In the example, the filter sector includes a high pass filter 221 (HPF), followed by a low pass filter 222 (LPF) and an amplifier 223 (Amp) to generate a filtered ripple signal AmpOut.

The ripple detector has a sample and hold unit 210 (marked S&H1) coupled to the calibration input via an input section (via signal AmpOut in the Figure), and a detector 215 having a detector input coupled to a sample and hold output signal of the sample and hold unit. The detector may be a comparator, which compares the sample and hold output signal to a reference level. For example, the reference level may be a predetermined level. Then the DC signal of Vtune is to be filtered out. The sample and hold unit 210 receives a sample signal from a control unit 230 (TXDIG), which sample signal has sample pulses on edges of a predetermined polarity in the modulation signal. The sample signal for the first sample and hold unit S&H1, and the corresponding ripple in the phase difference signal Vtune, and the corresponding filtered signal AmpOut, are shown in the Figure below the filter section. Also the detector output signal CalOut is shown having logical values 0 or 1 depending on the polarity of the ripple, as indicated by an arrow.

The calibration control unit 230 (TXDIG) also receives the detector output signal CalOut, and further controls the calibration process, such as determining a Data signal for modulating during calibration, e.g. a predetermined modulation pattern. Optionally calibration may also be performed based on actual operational modulation signals, so that modulation gain may be adjusted while operating.

Optionally, the ripple detector has a second sample and hold unit 211 (S&H2) coupled to the calibration input, for example receiving the filtered ripple signal AmpOut. Now said first sample and hold unit 210 is arranged for generating the first sample and hold output signal by sampling on positive edges in the modulation signal, and the second sample and hold unit 211 is arranged for generating a second sample and hold output by sampling on negative edges in the modulation signal. The detector 215 has a second detector input coupled to the second sample and hold output signal of the sample and hold unit, and being arranged for detecting a difference between said first detector input and the second detector input.

Optionally, the ripple detector has a further low-pass filter coupled to the calibration input, the low-pass filter being arranged for generating a reference signal by low-pass filtering the phase difference signal. The further low pass effectively removes the ripple signal, and only passes an average level, e.g. a DC level. The detector has a second detector input coupled to the reference signal, and, in operation, detects a difference between the phase difference signal on said first detector input and the reference level on the second detector input. The low-pass filter may have a longer reaction time, whereas using two S&H units enables a faster reaction irrespective of the DC value.

Optionally, the detector may be a difference amplifier for providing the detector output signal. The output level on the detector output corresponds to the peak level of the ripple as sampled by said sample and hold unit or units. The output level may be determined by the calibration control unit, and used for setting a correction of the modulation gain.

Optionally, the detector comprises a multi threshold comparator. In operation, such comparator provides, as the detector output signal, a respective one of a set of output values when the phase difference signal exceeds a respective threshold of multiple thresholds. The respective output value may be used by the calibration control unit for setting a respective, corresponding amount of correction of the modulation gain.

In a practical implementation various elements of the above circuit may be combined with the calibration arrangement in a single entity, such as an integrated semiconductor circuit (IC). For example, the device may include a digitally controlled oscillator constituting the voltage controlled oscillator. Also, the device may include the phase locked loop comprising the phase comparator, the divider and the modulation unit.

Figure 3:
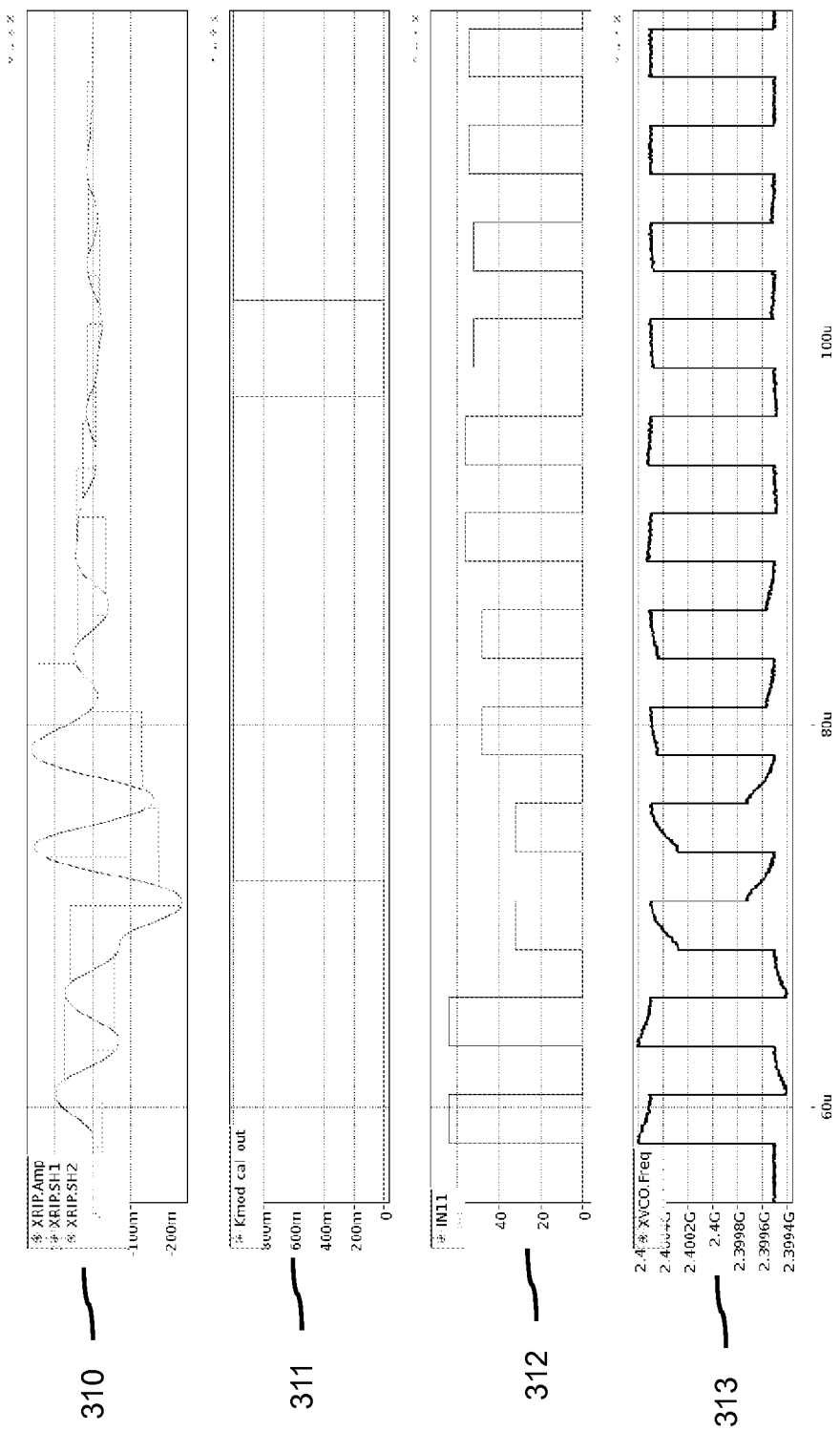
FIG. 3 shows an example of signals during a calibration process.

FIG. 3 shows an example of a calibration process. Four corresponding curves show different signals during calibration. The first graph 310 shows an example of a phase difference signal during the calibration process. The Vtune voltage is filtered and sampled, ripple value is stored in a sample and hold unit. The second curve 320 shows the detector output signal of the ripple detector, which indicates the polarity of the ripple. The polarity of the ripple is checked by the comparator that provides a digital output. The third curve 312 shows the oscillator modulation signal (VCO Mod), the amplitude of which is adjusted by gain adjustments in dependence of the detector output. The comparator output is used by the logic to run a successive approximation algorithm to optimize VCO gain. Finally, the fourth curve shows the output frequency, which should follow a modulation data signal. This curve shows, in the initial part, relatively strong deviation of the desired modulation pattern, while the final part shows that the frequency has the desired modulation pattern. Hence the modulation is adjusted up to a substantially perfect one by reducing any analog errors.

In a practical example the gain on the modulation signal input of the VCO is calibrated to optimize the EVM. A test signal at 200 KHz is sent by a modulation unit on the 2 ports and the mismatch between the divisor change and the VCO gain is measured via a ripple on the phase difference signal (Vtune). Vtune is filtered and amplified, and then sampled, to determine the ripple level and sign. The timing of the sampling needs to be well controlled, and may be programmable. The calibration unit measures the ripple of Vtune. If the frequency step is exactly 1 MHz there is only noise on Vtune (around 40uVpp). When an error is present on the VCO gain a ripple appears on Vtune (around 400uVpp for 3% error). The ripple is synchronous with the data signal so phase delay of the ripple from the data is indicative of a direction of changes of the gain.

For example, in a circuit as shown in FIG. 2, Vtune is high pass (100 kHz), and then low pass, filtered (low pass, 2nd order, 300 KHz) and amplified (40 dB). The filtered voltage is then sampled and hold by two sample and hold units controlled by two clocks based on respective positive or negative edges in the modulation signal. When the clock is high the switch is on (sample), when the clock is low the switch is off (hold). The comparator output indicates which signal is the highest, which determines the gain change direction.

Figure 4:
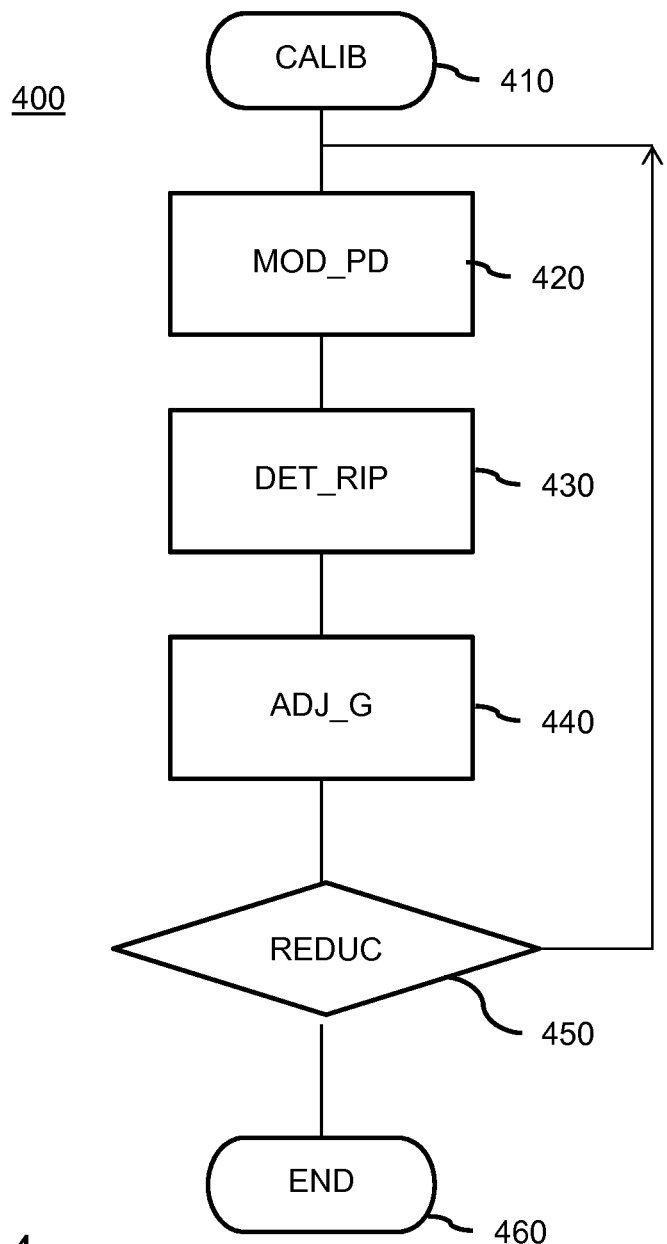
FIG. 4 shows an example of a method of controlling a frequency characteristic of a circuit of an electronic device.

FIG. 4 shows an example of a method of controlling a frequency characteristic of a circuit of an electronic device. The circuit may be a phase locked loop as described above, and provides a phase difference signal indicative of a frequency error due to modulating. The calibration method 400 starts when a calibration is required at node CALIB 410. A first step MOD_PH 420 provides a modulation and receives a corresponding phase difference signal. A second step DET_RIP 430 detects a ripple on the phase difference signal correlated to edges in the modulation signal. A third step ADJ_G 440 adjusts the gain on the modulation signal based on the detector output signal such that the ripple is reduced. Then, in step REDUC 450, it is determined whether the ripple is reduced. If the reduction is still insufficient, the method returns to the first step. If the required reduction is achieved the calibration process stops at node END 460.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

Furthermore, the units and circuits may be suitably combined in one or more semiconductor devices.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An electronic device, the device comprising a calibration arrangement for controlling a frequency characteristic of a circuit, the circuit comprising:
    a phase comparator having a first input for receiving a feedback signal and a second input for receiving a reference frequency and a phase comparator output for generating a phase difference signal;
    a voltage controlled oscillator having a first control input coupled to receive the phase difference signal and a second control input for receiving a second control signal, and an oscillator output for outputting an oscillator signal at an oscillation frequency controlled by the first and second control inputs;
    a divider having a first input coupled to receive the oscillation signal and an output for generating the feedback signal by dividing the oscillation signal by a divisor, the divisor of the divider being programmed based on a divisor control signal received via a divisor input; and
    a modulation unit having a modulation input for receiving a modulation signal, a first modulation output to provide the second control signal, and a second modulation output to provide the divisor control signal, and a change of the modulation signal generates a predefined change of the second control signal and a change of the divisor via the divisor control signal that is proportional to said predefined change; and
    the calibration arrangement comprising:
        a calibration input for receiving the phase difference signal;
        a ripple detector for providing a ripple detector output signal by detecting a ripple on the phase difference signal correlated to edges in the modulation signal; and
        a calibration control unit for generating a calibration control signal based on the ripple detector output signal,
        wherein the second control signal is adjusted based on the calibration control signal such that the detected ripple is reduced.

2. The device as claimed in claim 1, wherein the ripple detector further comprises a first sample and hold unit coupled to the calibration input, and a detector unit having a first detector input coupled to a first sample and hold output signal of the first sample and hold unit,
    the first sample and hold unit being arranged for generating the first sample and hold output signal by sampling on edges in the modulation signal.

3. The device as claimed in claim 2, wherein the ripple detector further comprises a second sample and hold unit coupled to the calibration input,
    said first sample and hold unit being arranged for generating the first sample and hold output signal by sampling on positive edges in the modulation signal, and
    the second sample and hold unit being arranged for generating a second sample and hold output signal by sampling on negative edges in the modulation signal, and
    the detector unit having a second detector input coupled to the second sample and hold output signal, and being arranged for detecting a difference between said first detector input and the second detector input.

4. The device as claimed in claim 2, wherein the ripple detector further comprises a low-pass filter coupled to the calibration input, the low-pass filter being arranged for generating a reference signal by low-pass filtering the phase difference signal, and
    the detector unit having a second detector input coupled to the reference signal, and being arranged for detecting a difference between said first detector input and the second detector input.

5. The device as claimed in claim 2, wherein the detector unit is a comparator.

6. The device as claimed in claim 2, wherein the detector unit is a multi-threshold comparator.

7. The device as claimed in claim 1, wherein the voltage controlled oscillator is a digital voltage controlled oscillator.

8. The device as claimed in claim 1, wherein the device further comprises a phase locked loop comprising the phase comparator, the divider and the modulation unit.

9. The device as claimed in claim 1, wherein the second control signal is adjusted by setting a modulation gain.

10. The device as claimed in claim 9, wherein setting the modulation gain uses successive approximation operations.

11. An integrated circuit comprising at least one electronic device according to claim 1.

12. A method of controlling a frequency characteristic of a circuit of an electronic device, the method comprising:
    generating, by a phase comparator of the circuit, a phase difference signal representing the phase difference between a feedback signal and a reference frequency, the feedback signal and the reference frequency being respectively received at first and second inputs of the phase comparator;
    generating, by a voltage controlled oscillator of the circuit, an oscillator signal at an oscillation frequency controlled by the phase difference signal and a second control signal respectively received at first and second control inputs of the voltage controlled oscillator;
    generating, by a divider of the circuit, the feedback signal by dividing the oscillation signal by a divisor, the divisor being programmed based on a divisor control signal received via a divisor input of the divider;
    receiving a modulation signal at a modulation unit of the circuit;

generating, by the modulation unit, the second control signal of the voltage controlled oscillator and the divisor control signal based at least in part on the received modulation signal, and a change of the modulation signal generates a predefined change of the second control signal and a change of the divisor via the divisor control signal that is proportional to said predefined change;

receiving the phase difference signal at a calibration input of a calibration arrangement;

detecting, via a ripple detector of the calibration arrangement, a ripple on the phase difference signal correlated to edges in the modulation signal; and generating, via a calibration control unit, a calibration control signal based on the results of the ripple detector, wherein the second control signal is adjusted based on the calibration control signal such that the detected ripple is reduced.

13. The method as claimed in claim 12, wherein detecting the ripple further comprises generating at least a first sample and hold output signal by sampling the phase difference signal on edges in the modulation signal, and detecting the ripple on the at least first sample and hold output signal using a detector unit.

14. The method as claimed in claim 13, wherein detecting the ripple further comprises:

generating, via a first sample and hold unit, the first sample and hold output signal by sampling the phase difference signal on positive edges in the modulation signal;

generating, via a second sample and hold unit, a second sample and hold output by sampling the phase difference signal on negative edges in the modulation signal; and detecting, via the detector unit, a difference between the first sample and hold output signal and the second sample and hold output signal.

15. The method as claimed in claim 13, wherein detecting the ripple further comprises generating a reference signal by low-pass filtering the phase difference signal, and detecting a difference between the at least first sample and hold output signal and the reference signal using the detector unit.

16. The method as claimed in claim 12, wherein the second control signal is adjusted by setting a modulation gain.

17. The method as claimed in claim 16, wherein setting the modulation gain uses a successive approximation process.

* * * * *